United States Patent
Tietz et al.

(10) Patent No.: US 6,835,684 B2
(45) Date of Patent: Dec. 28, 2004

(54) CERAMIC MATERIAL AND THE PRODUCTION THEREOF

(75) Inventors: Frank Tietz, Jülich (DE); Wolfgand Jungen, Eschweiler (DE); Frank Meschke, Buchenberg (DE); Rajendra Nath Basu, Calcutta (IN)

(73) Assignee: Forschungszentrum Julich GmbH, Julich (DE)

( * ) Notice: Subject to any disclaimer, the term of this patent is extended or adjusted under 35 U.S.C. 154(b) by 23 days.

(21) Appl. No.: 10/432,980

(22) PCT Filed: Nov. 27, 2001

(86) PCT No.: PCT/DE01/04497

§ 371 (c)(1),
(2), (4) Date: May 27, 2003

(87) PCT Pub. No.: WO02/44103

PCT Pub. Date: Jun. 6, 2002

(65) Prior Publication Data

US 2004/0047789 A1 Mar. 11, 2004

(30) Foreign Application Priority Data

Nov. 29, 2000 (DE) .......................................... 100 59 280

(51) Int. Cl.$^7$ ............................................. C04B 35/453
(52) U.S. Cl. ....................... 501/134; 501/135; 501/136; 501/137; 501/138; 501/152; 252/62.9 R; 252/62.9 PZ
(58) Field of Search ................................ 501/134, 135, 501/136, 137, 138, 152; 252/62.9 R, 62.9 PZ

(56) References Cited

U.S. PATENT DOCUMENTS

| 5,196,388 A | | 3/1993 | Shyu |
| 5,534,468 A | | 7/1996 | Stephenson |
| 5,604,048 A | * | 2/1997 | Nishihara et al. ............. 429/44 |
| 5,614,127 A | | 3/1997 | Khandkar et al. |
| 5,958,304 A | * | 9/1999 | Khandkar et al. ..... 252/519.15 |
| 6,551,522 B2 | * | 4/2003 | Hirose et al. .......... 252/62.9 R |

FOREIGN PATENT DOCUMENTS

| DE | 198 34 423 | 2/2000 |
| JP | 7-187841 | 7/1995 |

OTHER PUBLICATIONS

The Effect of Ca, Sr and Ba Substitutions . . . by Stambolova et al. (Vacuum/vol. 47, No. 10.(1996), no month provided.
Structural, Magnetic and Transport Properties . . . by Wang et al. (Journal of Appl. Phys. Vo. 90, No. 12,(2001), no month provided.
Materials for Lower Temperature Solid Oxide Fuel Cells by Ralph et al. (Journal of Materials Science(2001), no month provided.

\* cited by examiner

Primary Examiner—David Brunsman
(74) Attorney, Agent, or Firm—Herbert Dubno

(57) ABSTRACT

A ceramic material with a sintering temperature below 1000° C. and a Perovskite Structure with the general stoichiometric composition $A'_{1-x-y}A''_xB'_{1-a-b}B''_aB'''_bO_3$ whereby A'=Y, La, Pr, Nd; A''=Mg, Ca, Sr, Ba; B'=Mn, Ti, V, Cr, Ni, Zn, Pb, Sb, W, Zr; B''=Co; B'''=Cu, Bl; $0<x<=0.4$; $0<=y<=0.1$; $0.09<a<=0.6$ and; $0.09<=b<=0.6$.

16 Claims, 5 Drawing Sheets

CERAMIC MATERIAL AND THE PRODUCTION THEREOF

This application is a 371 of PCT/DE01/04497, filed 27 Nov. 2001.

TECHNICAL FIELD

The invention relates to a ceramic material, especially an electrically conductive ceramic material, as well as its production and use.

STATE OF THE ART

Electrically conductive ceramics are typically used as connecting elements between components. These ceramics ensure on the one hand an electrical contact between two components with which these connecting elements have as a consequence of a joining process an intimate material to material contact. On the other hand electrical conductive paths can be formed from such ceramics and which are located in or on a component and either as a consequence of an applied electric current can induce a physical-chemical change in the component (actuator function) or can transform a change of a physical-chemical characteristic of the component into an electrically measurable magnitude (sensor function).

From the literature a series of manufacturing processes are known which give rise to being sintered at low temperatures. Very often synthesis methods have involved sol-gel intermediate products or nanophasal powders to lower the sintering temperatures of ceramics. Such processes are characterized by the fact that they require very expensive (frequently metal-organic) starting materials and auxiliary materials and produce only very small quantities, see for example U.S. Pat. No. 4,636,378.

Another method of obtaining low sintering ceramics is known from EP 0 280 033 B1. In this case, precipitation reactions are carried out with, for example, hydroxides or oxalates. These have the drawbacks that the salts which are frequently formed, tend to separate out in complex compositions on the one hand or because of different solubility products of the salts precipitate only incompletely, and can thus give rise to deviations from stoichiometry of the products. A further disadvantage is frequently the need for organic solvents or purification agents which increase the cost of the fabrication process.

Furthermore, from U.S. Pat. No. 3,330,697, a fabrication process for niobates, zirconates and titanates of lead and alkaline earth metals is known. In this case, into a solution of polyhydroxy alcohol and citric acid compounds of titanium, zirconium and niobium are mixed with lead or alkaline earth salts. By heating the solution, the organic components are removed. This method of production is known in the literature as the Pechini method. This method is however not suitable for ceramics sintering at low temperatures as described in the patent. The polyhydroxy alcohols which are there used have the disadvantage that the basic solution with the cations and the citric acids, upon heating, is transformed into a viscous resin. In addition, the higher proportions of organic auxiliary materials can give rise to a spontaneous combustion of the viscous resin with further temperature elevation in the examples given. Investigations of this fabrication process as well as of other fabrication processes which are based on uncontrollable ignition of the intermediate product have shown a significant limitation of the sinterability of the ceramic powder which is obtained. A heating like that which results from the combustion of the resin is thus to be strictly avoided in the fabrication of being sintered at low temperature.

OBJECTS AND SOLUTION

The object of the invention is to obtain a ceramic material which, by comparison with the state of the art, has improved sinterability and reduced sintering temperature. In addition the ceramic material should have good electrical properties. Further it is an object of the invention to provide a fabrication process for such a ceramic material.

DESCRIPTION OF THE INVENTION

With the method according to the invention of claim 1, at least two different metal nitrates or metal carbonates are dissolved in an aqueous solution together with a metal complex former, concentrated, and at low temperature converted to a solid.

The metal can be at least one metal from the first group A'=(Y, Sc, Ce, La, Pr, Nd, Sm, Eu, Gd) and at least one metal from a second group B=(Ti, V, Cr, Mn, Fe, Co, Ni, Cu, Zn, Zr, Nb, Mo, W, Sn, Sb, Pb, Bi).

As the metal complex former, any complex former which is soluble in water is suitable which can complex with the above-mentioned metals and bring them as metal ions into solution. The metal complex formers which are to be counted in this group are especially the lactic acids, the citric acids, the citric acid esters or also the tartaric acid complexers. Furthermore, suitable are also other polycarboxylic, polyhydroxycarboxylic acids or polyaminocarboxylic acids like, for example, EDTA, (ethylenediamenetetraacetic acid).

The solution of metal complex former and metal salts is heated in such a way that the metal complex former decomposes. This can be achieved by for example splitting off gaseous carbon monoxide or carbon dioxide ($CO$, $CO_2$) or by splitting off also gaseous nitrogen oxides ($NO_x$). By means of the heating, water is simultaneously evaporated from the aqueous solution so that the initially dissolved or complex metal ions form a solid.

In an advantageous embodiment of the method, at least on metal of the group A''=(Mg, Ca, Sr, Ba) is dissolved as a nitrate or as a carbonate in the aqueous solution.

In an advantageous embodiment of the method, the metal compounds are used in a predetermined ratio. To that effect, the stoichiometry of the metals in a ceramic of the following compositions should be met: $ABO_3$, $A_2BO_4$ or $A_2B_2O_7$ where A stands for the elements of the mentioned groups A' and A'' and B for the mentioned elements of group B.

It has been found to be advantageous further when, with the method according to the invention, different metals of group B are used in different proportions. In this case, especially the following compositions have been found to be especially desirable:

| Composition | Shorthand Designation in FIG. 2: |
|---|---|
| a) $La_{0.8}Ca_{0.2}Cr_{0.1}Co_{0.6}Cu_{0.3}O_3$ | LCC-A |
| b) $La_{1.6}Ca_{0.4}Cr_{0.1}Co_{0.6}Cu_{0.3}O_4$ | |
| c) $La_{1.6}Ca_{0.2}Cr_{0.1}Co_{0.3}Cu_{0.6}O_3$ | |
| d) $La_{0.8}Ca_{0.2}Cr_{0.1}Co_{0.5}Bi_{0.1}Cu_{0.3}O_3$ | LCC-B |
| e) $La_{0.6}Y_{0.2}Ca_{0.2}Mn_{0.2}Fe_{0.3}Co_{0.3}, Cu_{0.2}O_3$ | LCC-C |
| f) $La_{0.4}Y_{0.4}Ca_{0.2}(Mn_{0.8}Co_{0.1}, Cu_{0.1})_{0.9}O_3$ | LCC-D |
| g) $La_{0.75}Bi_{0.05}Ca_{0.2}(Mn_{0.3}Co_{0.4}, Cu_{0.3})O_3$ | |

-continued

| Composition | Shorthand Designation in FIG. 2: |
|---|---|
| h) $La(Mn_{0.4}Co_{0.4}Cu_{0.2})_{0.95}O_3$ | LCC-E |
| i) $La(Mn_{0.45}Co_{0.35}Cu_{0.2})O_3$ | LCC-F |
| j) $LaMn_{0.35}Co_{0.45}Cu_{0.2})O_3$ | |
| k) $LaFe_{0.6}Ni_{0.4}O_3$ | |
| l) $La_{0.8}Ca_{0.2}(Pb, Zr, Ti)_{0.2}Co_{0.5}Cu_{0.3}O_3$ | |
| m) $La_{0.95}Ca_{0.05}(Pb, Zr, Ti)_{0.2}Co_{0.5}Cu_{0.3}O_3$ | |
| n) $La(Pb, Zr, Ti)_{0.1}Mn_{0.3}Co_{0.45}Cu_{0.15}O_3$ | |
| o) $Y_{0.5}Ca_{0.5}Mn_{0.4}Co_{0.4}Cu_{0.2}O_3$ | |
| p) $Y_{0.5}Ba_{0.5}Mn_{0.3}Co_{0.4}Ti_{0.15}Cu_{0.15}O_3$ | |

The compositions indicated under a) to k) are advantageously suitable for use in fuel cells while the compositions described under l) to p) are advantageous for use in piezoceramics.

The heating of the aqueous solution is carried out especially slightly initially until the major part of the water is evaporated. Then the temperature is increased further, especially to up to 700° C. At these temperatures the materials according to the invention are transformed advantageously into a Perovskite or a multiphase ceramic which has as a major component a Perovskite.

The ceramic material according to the invention of claim 8 is produced by the method of the invention and has the following composition:

$$A'_{1-x-y}A''_xB'_{1-a-b}B''_aB'''_bO_3$$

with

A'=(Y, Sc, Ce, La, Pr, Nd, Sm, Eu, Gd)
A''=(Mg, Ca, Sr, Ba)
B'=(Mn, Fe, Co)
B''=(Ti, V, Cr, Ni, Zn, Pb, Sb, W, Zr)
B'''=(Cu, Bi)
x=0–0.6 y=0–0.2
a=0–1 b=0–0.8

The material is electrically conductive and usually has a significantly improved sinterability by comparison with conventional ceramics. By an improved sinterability is to be understood a lower temperature range for the sintering which can be in the range from 800° C. to significantly below 1000° C. In addition, such materials have a smaller grain size distribution than those materials which are known in accordance with the state of the art. The typical order of magnitude for the individual particles (proportion greater than 80%) is in the range of 0.2 to 7 $\mu$m with a mean particle diameter of 1 to 2 $\mu$m. This smaller grain size usually results in a significantly improved homogeneity of the ceramic during the sintering process.

Furthermore, by suitable choice of the metals used a smaller thermal expansion coefficient in the range of $1\times10^{-6}$ $K^{-1}$ to $16\times10^{-6}$ $K^{-1}$, especially between $3.5\times10^{-6}$ $K^{-1}$ and $13\times10^{-6}$ $K^{-1}$ can be established in a close to optimal manner. This is especially the case for the exemplary compositions l), n) and p).

The establishment of thermal expansion coefficients is especially of advantage when the material according to the invention is to be used as a connecting element either for high temperature fuel cells or together with piezoelectrics or dielectrics. The thermal expansion coefficients of the latter materials lie in the range of about 3.5 to $6.5\times10^{-6}$ $K^{-1}$. Layers with thermal expansion coefficients which are so matched give rise as a rule to fewer mechanical stresses than with conventional connecting elements like for example those composed of silver, palladium or platinum. These have in the same temperature interval a substantially higher expansion coefficient ($22.5\times10^{-6}$ $K^{-1}$ for Ag, $13.5\times10^{-6}$ $K^{-1}$ for Pd and $9.8\times10^{-6}$ $K^{-1}$ for Pt). Furthermore, the described exemplary compositions l), m) and n) contain the elements of piezo lectrics and dielectrics so that a very good chemical compatibility and reduced piezo and dielectric characteristics can be assured generally with improved long term stability of the ceramics.

Advantageously, the ceramics according to the invention, can be used for example in piezoelectrics (sensors or actuators), which as a rule are comprised of barium titanate or lead-zirconium-titanium-oxide ($PbZr_{1-x}Ti_xO_3$, or for short PZT). Both of these classes of material are comprised, like the ceramics according to the invention, of the advantageous configuration of Perovskites.

If the material is in the form of a Perovskite, it has slight piezoelectric properties so that during a mechanical stress a component fabricated therefrom can produce reduced stresses between individual elements and thus contribute to a longer useful life of the component. The material according to the invention is further suitable especially for use as electrically conductive connecting elements, especially for metal-metal, metal-ceramic or ceramic-ceramic bonding.

A connecting element from the material according to the invention is, in addition, suitable for use in high temperature fuel cells (SOFC) in which these c ramics form a fixed junction between metallic bipolar plates and the cathode. These ceramic materials according to the invention can thus replace noble metals, like silver, palladium or platinum, as electrically conductive contacts. As a result there is an improvement over the state of the art alone in the reduced material cost.

Advantageously, the application and formation of junctions between PZT ceramics and the connection materials of the invention can be easily realized. If conventional PZT ceramics are used, these in general are sintered at temperatures of 1200° C. A joining process at 800 to 1000° C. can thus be achieved easily. Low temperature sintering PZT ceramics with sintering temperatures below 1000° C. permit sintering of them together with the materials according to the invention and it is possible thereby to save one process step, i.e. a temperature treatment.

BRIEF DESCRIPTION OF THE DRAWINGS

Below the invention is described in further detail based upon the Figures and examples. The Figures show.

EXAMPLE 1

As the first example, the production of a 100 gram powder charge with the desired composition of $La_{0.8}Ca_{0.2}Cr_{0.1}Co_{0.6}Cu_{0.3}O_3$ is described. As starting salts the following chemicals were used:

$La(NO_3)_3 \times 6H_2O = 152.7$ g $Ca(NO_3)_2 \times 4H_2O = 20.8$ g $Cr(NO_3)_3 \times 9H_2O = 17.7$ g $Co(NO_3)_2 \times 6H_2O = 77.0$ g $Cu(NO_3)_2 \times 3H_2O = 32.0$ g Citric acid-monohydrate=170.0 g The weighed-out salts were dissolved in a small amount of distilled water—only as much as was required—with stirring in a quartz vessel with a flat bottom. After complete dissolution of the salts, a twice molar quantity of citric acid was added and also brought into solution to complex the cations.

The mixture was evaporated on a hot plate until a viscous mass was obtained. Then, using a gas burner, the temperature was raised carefully until a solid mass resulted. In this phase mixing can lead to strong foaming because of the beginning decomposition of the citric acid. The mixture was then calcined in a chamber furnace with a heating rate of 3 K/min for 3 hours at 700° C. in air.

The resulting powder was then milled in a planet mill (PM) to break up larger agglomerates. A suitable milling condition for this amount of powder was found to be 2 hours in ethanol at 6000 RPM in a $ZrO_2$ milling beaker and milling balls with a diameter of 1 cm.

The following further special embodiments of the material according to the invention are given in conjunction with potential advantageous fields of use.

EXAMPLE 2

Use in a High Temperature Fuel Cell

A high temperature fuel cell is assembled in general from the following components:

An electrolyte of yttria-stabilized zirconium oxide (YSZ), a cathode of lanthanum manganite and an anode of the composite material Ni and YSZ.

In order to generate sufficient power, the individual cells are connected with one another serially to a cell stack. As the electrical connecting component, the so-called interconnector, an Fe—Cr based alloy is suitable. With the aid of ceramic paste made from the above-described powder, the individual cells are connected together and simultaneously fabrication tolerances are bridged. The cell stack for the joining process was subjected to a temperature treatment which hardened the pastes and bonded them by diffusion processes fixedly with the neighboring cell component. The connecting elements had high electrical conductivity under the operating conditions of the fuel cells, matched in thermal expansion coefficients those of the remaining cell components and manifested chemical stability and compatibility with the neighboring cell components since they were made of similar chemical compounds to those of the cathodes.

Figure 5:
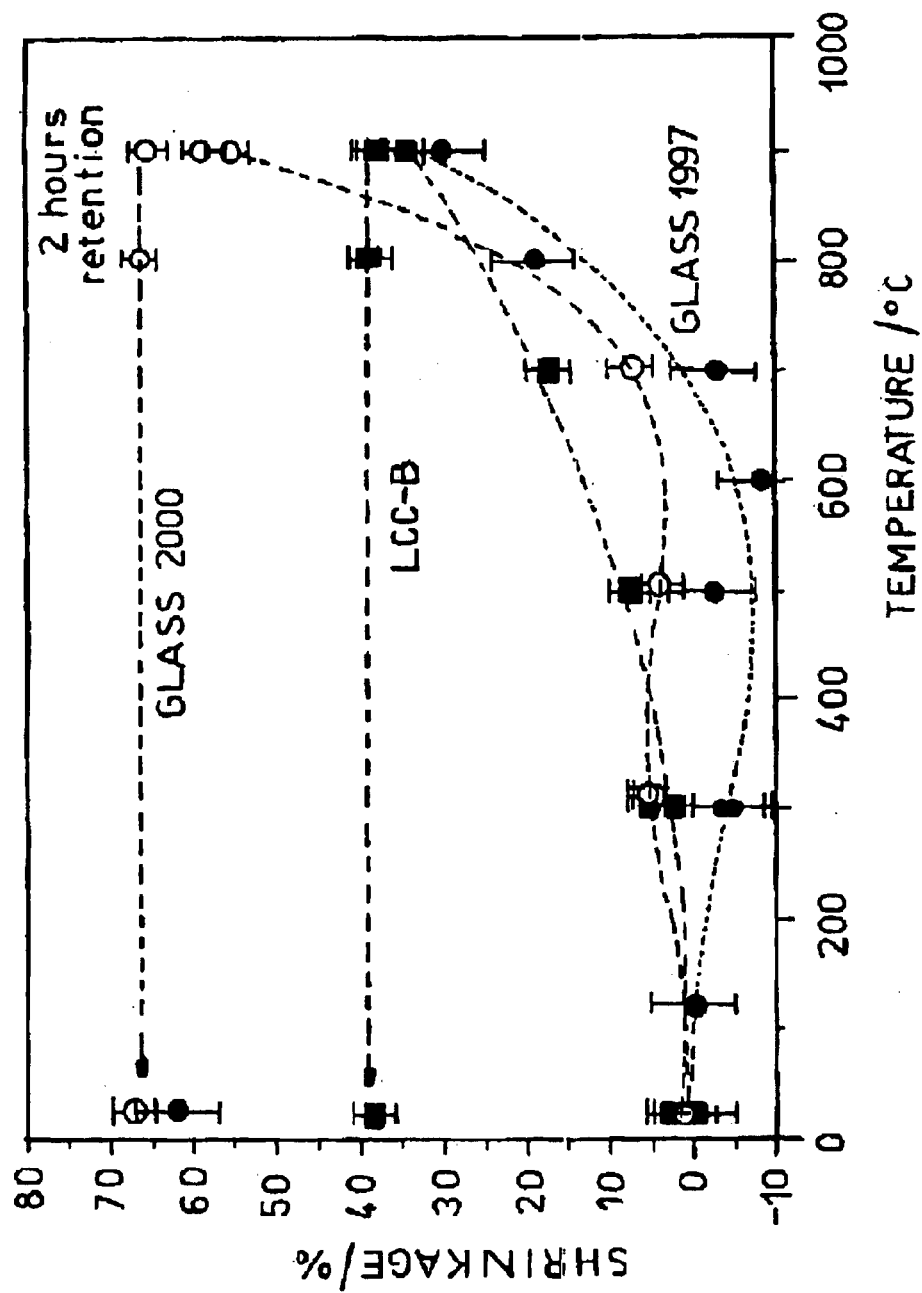
FIG. 5: The shrinkage graph of glass ceramics up to 900° C. (open symbols) and a ceramic contact paste LCC-B (filled symbols) under slight pressure load to simulate a fuel cell joining process.

During the joining process, because of the good sinterability of the connecting elements, the shrinkage of the layers formed thereby was well matched to the shrinkage of the simultaneously sintering glass ceramic as was required for the sealing of the gas spaces between anode and cathode (see FIG. 5).

A special refinement of the inventive concept resides in that a ceramic material which is applied as a connecting layer to an interconnector or to the cathode, has the following chemical compositions:

$$A'_{1-x-y}A''_xB'_{1-a-b}B''_aB'''_bO_3$$

with

A'=(Y, Sc, Ce, La, Pr, Nd, Sm, Eu, Gd)

A"=(Mg, Ca, Sr, Ba)

B'=(Mn, Fe, Co)

B"=(Ti, V, Cr, Ni, Zn, Pb, Sb, W, Zr)

B'''=(Cu, Bi)

x=0–0.6 y=0–0.2 a=0–1 b=0–0.8

As especially favorable compositions, the prior compounds have the compositions $$A'_{1-x-y}A''_xMn_{1-a-b}B''_aCu_bO_3$$

where

A'=(La, Pr, Nd)

A"=(Ca, Sr,)

B'=(Cr, Fe, Co)

x=0–0.4 y=0–0.1 a=0–0.6 b=0.1–0.6

Since during the high temperature operation treatment on the boundary layer between the connecting element and steel, chromates, like $CaCrO_4$ are formed among other compounds, the A" component should be selected to be as small as possible, especially x=0. This choice depends however substantially upon the required electrical conductivity since this falls with decreasing A" content.

EXAMPLE 3

Use With Piezoceramics, For Example, as Contacts For Sensors And Actuators

For the PZT ceramics, smaller thermal expansion coefficients have to be realized than for the use in high temperature fuel cells. For this purpose higher proportions of Y and Cr can be used. Too high a yttrium proportion reduces however the conductivity significantly.

This effect can be compensated however by increasing the A" proportion. The range of variations of the compositions can b summarized as follows:

$$A'_{1-x-y-z}Y_zA''_xMn_{1-a-b}M''_aCu_bO_3$$

with

A'=(La, Pr, Nd)

A"=(Ca, Sr, Ba)

x=0–0.8 y=0–0.05 z=0.1–0.8 and the cases:

M"=Cr with a=0–0.4 b=0.1–0.6

M"=Fe with a=0–1 b=0.1–0.6

M"=Co with a=0–0.3 b=0.1–0.6 as well as mixtures of the cations Cr, Fe, Co within the indicated limits.

Advantageous are further additions of B"=(Pb, Zr, Ti) with a proportion of up to 0.2 (see also the exemplary compositions l) to n) in connection therewith). Additions in this order of magnitude reduce the chemical diffusion gradients and thus reduce a chemical exchange between the connecting elements and the PZT ceramic. The materials can be processed by conventional processes with the aid of screen printing techniques to conductive tracks in order to make actuators or sensors, whereby a joining process can be carried out after fabrication of the ceramic body or simultaneously with the fabrication of the ceramic body.

DESCRIPTION OF THE FIGURES

Figure 1:
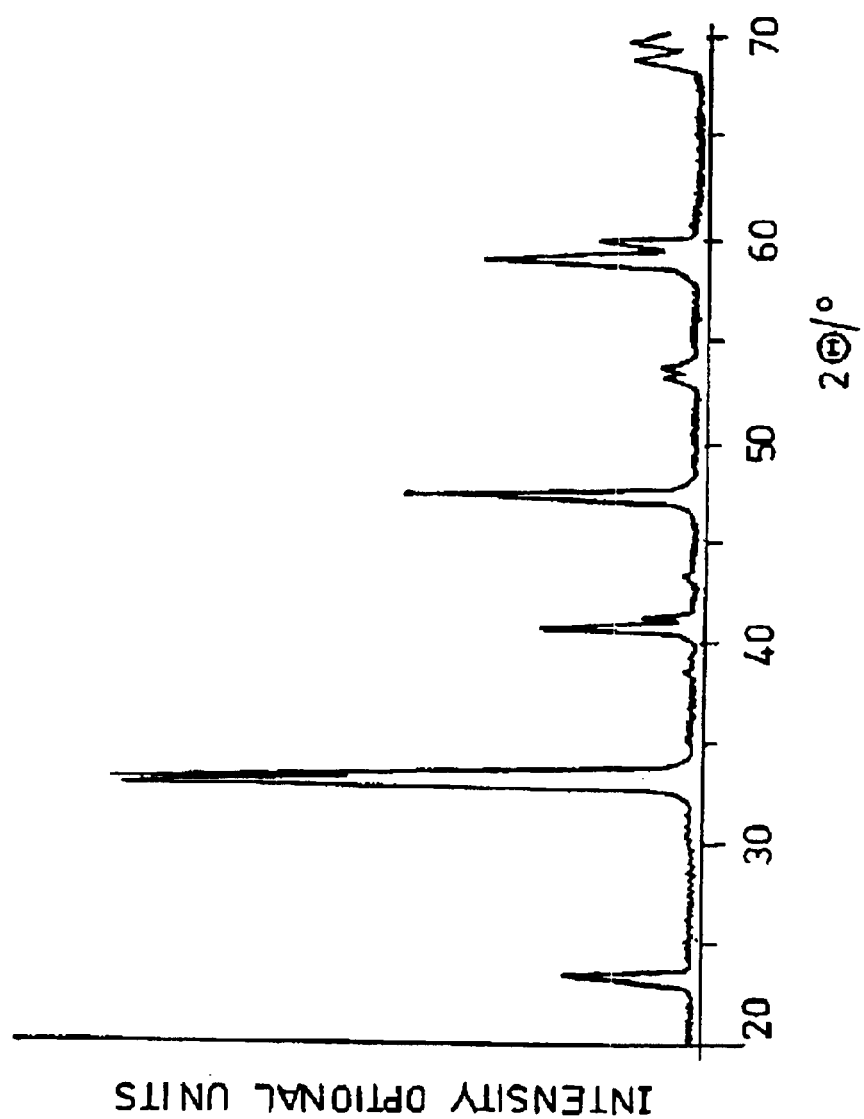
FIG. 1: An X-ray diffraction pattern of a Perovskitic ceramic powder (LCC-A) after a temperature treatment of 3 hours at 900° C.

FIG. 1 shows an x-ray diffraction pattern of the described powder in Example 1 (LCC-A) after a temperature treatment of 3 hours at 900° C. The diffraction pattern which results is that of the Perovskite structure, additional x-ray reflections from other crystalline phases being not recognizable. With higher copper concentrations, complex cuprates are formed which however also have high conductivity and do not interfere with the applications.

Figure 2:
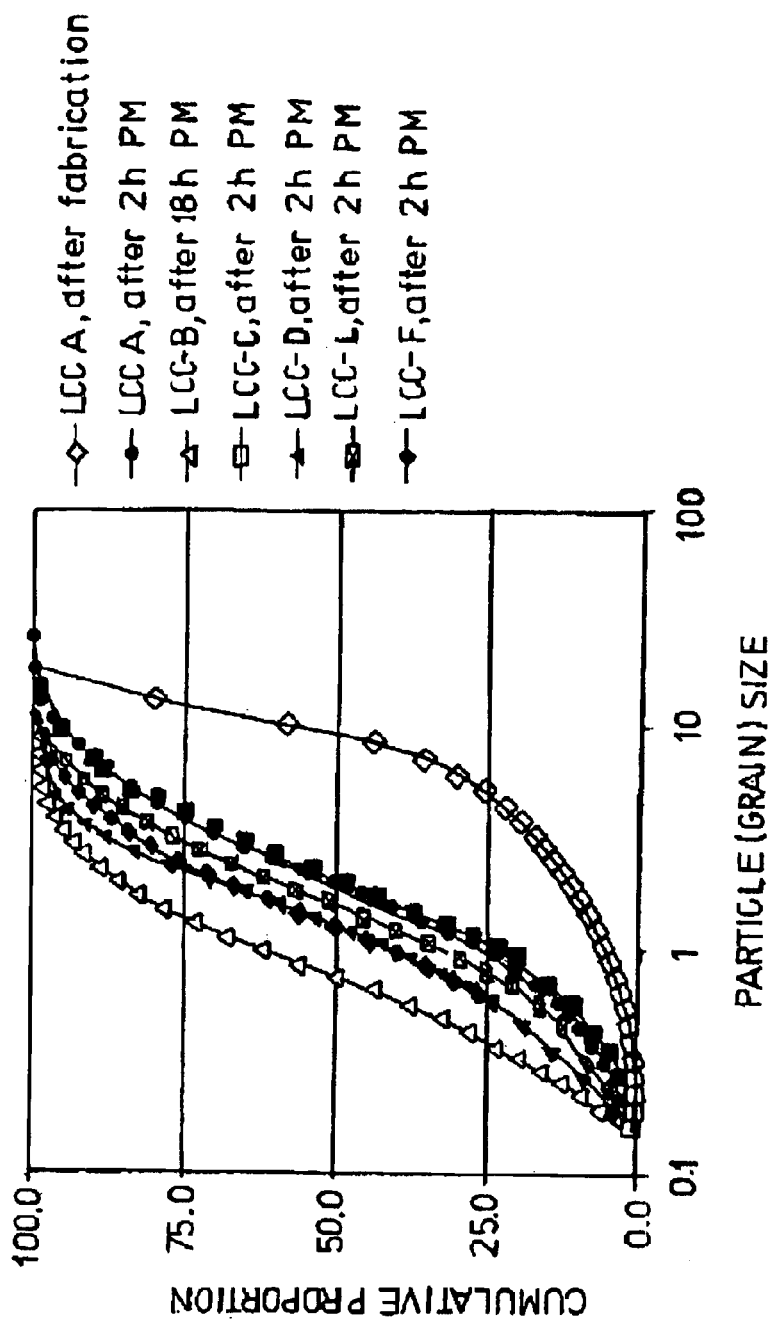
FIG. 2: A particle size distribution of the Perovskitic ceramic powder.

In FIG. 2, the particle size [grain size] distributions of powders of differ nt composition are shown. After fabrication, particle agglomerates may be present of diameters up to 20 μm and are broken up by a short duration milling of 2 hours in a planet mill (PM). The powder then has a highly uniform particle size distribution with a mean particle size ($d_{50}$) of 1 to 2 μm. With further milling in a planet mill, the mean particle size reaches about 0.8 μm which is only slightly smaller. In total, usually above 80% of the particles have a particle size between 0.2 and 7 μm.

Figure 3:
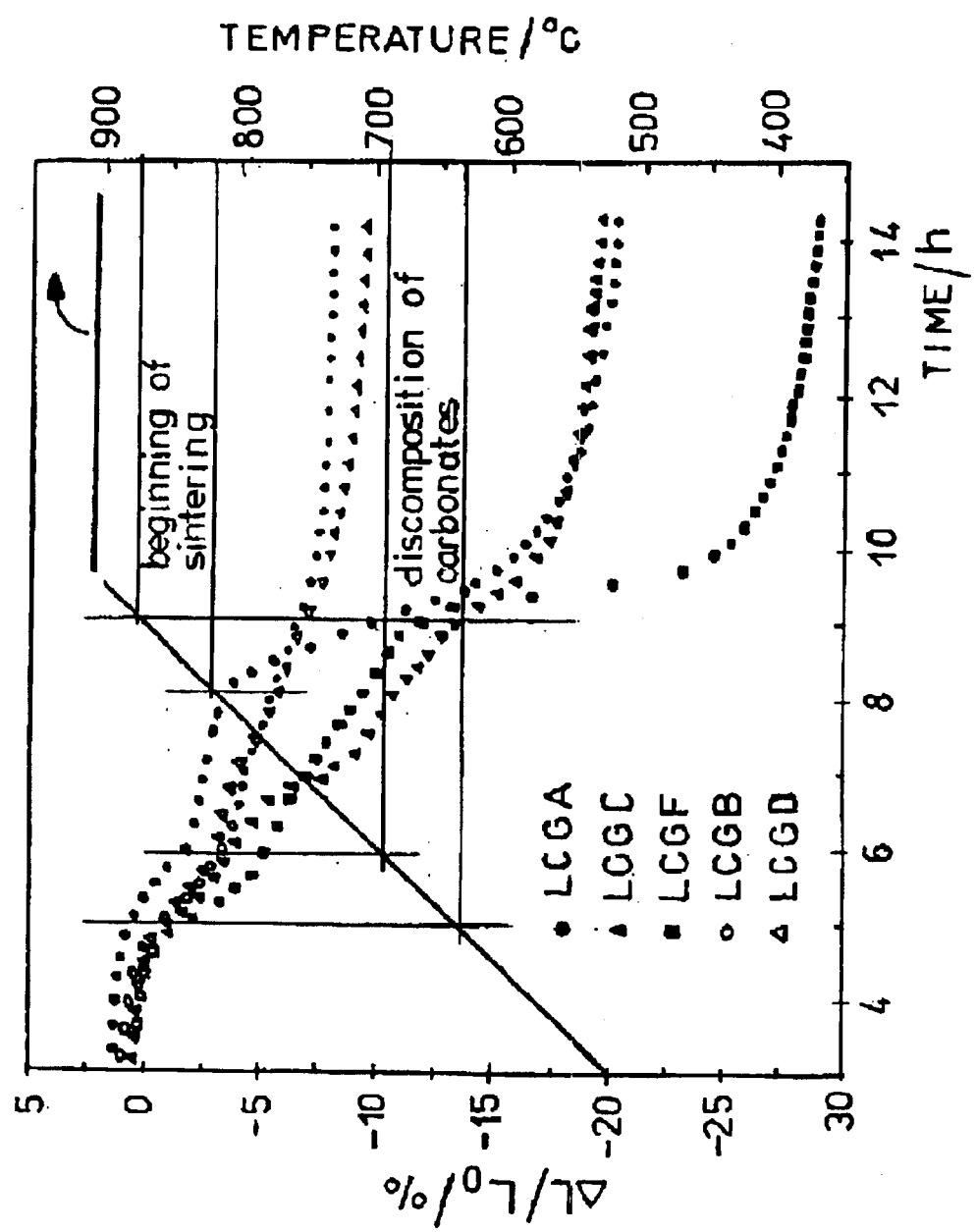
FIG. 3: Sintering curves of 5 Perovskitic ceramic samples up to 900° C. The highest shrinkage rate occurred at about 850° C.

FIG. 3 shows by way of example five sintering curves of Perovskitic ceramic samples as measured on pressed sample bodies. A starting shrinkage at about 600 to 700° C. is due to the decomposition of carbonate residues in the calcined powder and which can be formed by the decomposition of the citrate salts. With higher temperatures, the intrinsic shrinkage occurs between 800 and 900° C. At 900° C. the shrinkage is already between 20 and 30% in the longitudinal direction.

Figure 4:
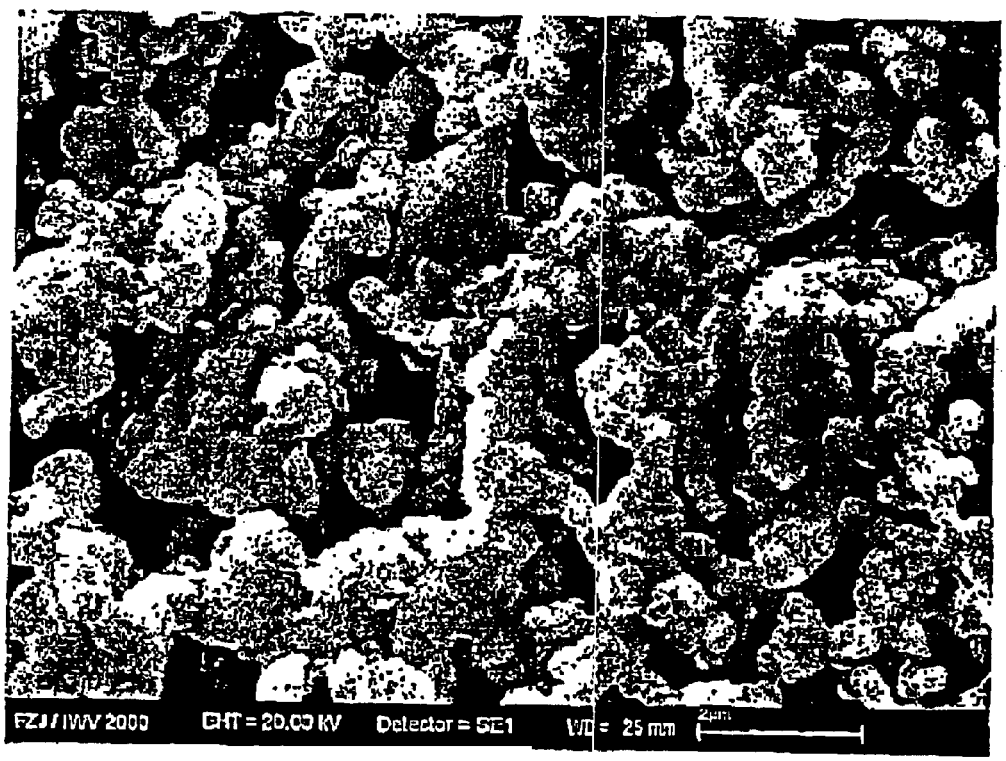
FIG. 4: The micro-structure of a screen printed contact layer (LCC-B) after sintering at 900° C. for 2 hours.

The morphology of a sintered sample which is comprised of the ceramic paste of the above-mentioned contact material (LCC-B) and which has been sintered at 900° C. for two hours is reproduced in FIG. 4. The individual ceramic particles are very well sintered tog ther already at this temperature and form a stable continuous network with high conductivity. The primary grains of the ceramic have a mean diameter of 0.5 to 1 μm.

FIG. 5 shows measurements of the shrinkage properties of pressed sample bodies. The length changes reproduced in FIG. 4 show indeed the potential of the material and their tendential sintering properties, the shrinkage for example during a joining process in a high-temperature fuel cell can however only be tested under conditions approaching reality. For this purpose, such a fuel cell was coated with a paste of the contact material LCC-A of example 1, sealed with a glass solder and between upper and lower interconnector plates, placed in a furnace for simulation of a cell stack under an optical observation device. During the formation of the junction a small load is applied to the component composite and the change in the contact layer thickness and the solder thickness was measured. From the course of the curves in FIG. 5, it can be seen that in a true use of the contact layer there is a shrinkage of about 40%. Furthermore, the shrinkage of the ceramic is well matched to the shrinkage properties of the glass solder used.

What is claimed is:

1. A ceramic material with a sintering temperature below 1000° C. and a Perovskite structure with the general stoichiometric composition

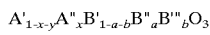

$$A'_{1-x-y}A''_{x}B'_{1-a-b}B''_{a}B'''_{b}O_3$$

whereby:

A'=at least one element or a mixture from the group Y, La, Pr, Nd,

A"=an element or a mixture from the group Mg, Ca, Sr, Ba,

B'=at least one element or a mixture from the group Mn, Ti, V, Cr, Ni, Zn, Pb, Sb, W, Zr, B"=Co, B'''=at least one element or a mixture from the group Cu, Bi, and $0<x\leq 0.4$, $0\leq y\leq 0.1$, $0.09<a\leq 0.6$ and $0.09\leq b\leq 0.6$.

2. A ceramic material according to claim 1 with $0.3<a\leq 0.6$.

3. A ceramic material according to claim 1 with $0.15\leq b\leq 0.6$.

4. A ceramic material according to claim 1, which has La as the element in the A' position.

5. A ceramic material according to claim 1 in which Y is at least one of the elements in the A' position.

6. A ceramic material according to claim 1 which has Cu as the element in the B''' position.

7. A ceramic material according to claim 1 in which Cr, Ti or Mn is the element in the B' position.

8. A ceramic material according to claim 1 which upon heating to a temperature of 900° C. has a shrinkage of at least 10% and especially of more than 15%.

9. A ceramic material according to claim 1 with the following stoichiometric composition: $La_{0.8}Ca_{0.2}Co_{0.6}Cr_{0.1}Cu_{0.3}O_3$, $La_{1.6}Ca_{0.4}Co_{0.6}Cr_{0.1}Cu_{0.3}O_3$, $La_{0.8}Ca_{0.2}Co_{0.3}Cr_{0.1}Cu_{0.6}O_3$, $La_{0.8}Ca_{0.2}Co_{0.5}Cr_{0.1}Bi_{0.1}Cu_{0.3}O_3$, $Y_{0.5}Ba_{0.5}Mn_{0.3}Co_{0.4}Ti_{0.15}Cu_{0.15}O_3$, $La_{0.8}Ca_{0.2}Co_{0.5}(Pb,Zr,Ti)_{0.2}Cu_{0.3}O_3$, $La_{0.95}Ca_{0.05}Co_{0.5}(Pb,Zr,Ti)_{0.2}Cu_{0.3}O_3$, $Y_{0.5}Ca_{0.2}Mn_{0.4}Co_{0.4}Cu_{0.2}O_3$, $La_{0.4}Y_{0.4}Ca_{0.2}(Mn_{0.8}Co_{0.1}Cu_{0.1})_{0.9}O_3$ or $La_{0.75}Ca_{0.2}Mn_{0.3}Co_{0.4}Cu_{0.3}Bi_{0.05}O_3$.

10. A connecting element for a fuel cell comprising the composition of claim 1.

11. A contact element for a piezoceramic comprising the composition of claim 1.

12. A method of making a ceramic material according to claim 1 with the steps of:

a) dissolving in an aqueous solution including a metal complex former
  at least one compound from the group of A'=Y, La, Pr, Nd as the nitrate and/or carbonate, and
  at least one compound of the group B'=Mn, Ti, V, Cr, Fe, Ni, Zn, Pb, Sb, W, Zr as the nitrate or carbonate and
  at least one compound from the group B'''=Cu, Bi as the nitrate or carbonate, and b) heating the aqueous solution whereby the metal complex former decomposes and the ceramic material is formed.

13. The method according to claim 12 in which at least a third compound from the group A"=Mg, Ca, Sr, Ba is dissolved in the aqueous solution as the nitrate or carbonate.

14. The method according to claim 12 in which a polycarboxylic acid is used as the metal complex former.

15. The method according to claim 12 in which citric acid is used as the metal complex former.

16. The method according to claim 12 in which the heating is applied to 700° C.

* * * * *